(12) United States Patent
Weggel et al.

(10) Patent No.: US 7,535,303 B1
(45) Date of Patent: May 19, 2009

(54) ACTIVE LC FILTER DAMPING CIRCUIT WITH GALVANIC ISOLATION

(75) Inventors: Craig R. Weggel, Willow Grove, PA (US); Donald A. Yost, Lansdale, PA (US); James P. Detweiler, Lansdale, PA (US)

(73) Assignee: Performance Controls, Inc., Montgomeryville, PA (US)

( * ) Notice: Subject to any disclaimer, the term of this patent is extended or adjusted under 35 U.S.C. 154(b) by 0 days.

(21) Appl. No.: 11/497,194

(22) Filed: Aug. 1, 2006

Related U.S. Application Data

(63) Continuation of application No. 11/287,146, filed on Nov. 23, 2005, now abandoned.

(60) Provisional application No. 60/630,888, filed on Nov. 24, 2004.

(51) Int. Cl.
*H03F 1/38* (2006.01)

(52) U.S. Cl. .......................................... 330/291; 363/39

(58) Field of Classification Search ......... 327/551–559, 327/291, 297; 330/297; 363/39–41
See application file for complete search history.

(56) References Cited

U.S. PATENT DOCUMENTS

| | | | |
|---|---|---|---|
| 5,323,303 A * | 6/1994 | Dolland | 363/39 |
| 5,606,289 A | 2/1997 | Williamson | |
| 5,691,626 A * | 11/1997 | Esser et al. | 323/205 |
| 6,441,685 B1 * | 8/2002 | MacMillan | 330/10 |
| 6,552,606 B1 * | 4/2003 | Veltman et al. | 330/10 |
| 6,765,452 B2 | 7/2004 | Yuan et al. | |
| 6,950,321 B2 | 9/2005 | Stancu et al. | |

* cited by examiner

*Primary Examiner*—Dinh T. Le
(74) *Attorney, Agent, or Firm*—Steven M. Koehler; Westman, Champlin & Kelly, P.A.

(57) ABSTRACT

A method and apparatus for providing electrical power through two terminals to a load wherein a portion of a LC filter circuit is connectable to each of the terminals. A feedback circuit having a sense capacitor is operably couplable to both portions of the LC output filter. The feedback circuit provides a feedback signal when a frequency of AC voltage across the sense capacitor substantially reaches the resonant frequency of the LC output filter so as to actively damp the voltage across the load.

20 Claims, 3 Drawing Sheets

US 7,535,303 B1

ACTIVE LC FILTER DAMPING CIRCUIT WITH GALVANIC ISOLATION

CROSS-REFERENCE TO RELATED APPLICATION

The present application is a continuation of and claims priority of Ser. No. 11/287,146, filed Nov. 23, 2005, which is based on and claims the benefit of U.S. provisional patent application Ser. No. 60/630,888, filed Nov. 24, 2004, the contents of which are hereby incorporated by reference in their entirety.

BACKGROUND OF THE INVENTION

The discussion below is merely provided for general background information and is not intended to be used as an aid in determining the scope of the claimed subject matter.

It is common to provide filtering of power electronic amplifiers in order to remove high frequency elements therein. One common approach is to use a LC (inductor-capacitor) in the output stage across which the output power for the load is obtained. Although such a filter is effective in removing high frequency components, a problem arises if the resonant frequency of the LC filter is in the operational range of the power amplifier. In such cases, an undesirable large voltage can develop across the load at the resonant frequency. Thus, a method of damping the natural response of the LC filter to prevent unwanted and excessive load voltage is necessary.

Various approaches of damping have been used. In a first form, damping is provided by using a dissipative approach, generally in the form of a resistor or a combination of a resistor and a capacitor. However, this approach results in unnecessary and potentially high levels of power dissipation. In an alternative approach, active damping is used. However, active damping requires the use of a control loop and therefore, a method of sensing the output voltage.

Two known methods of sensing output voltage have been used. The first method requires the use of high impedance resistors and a differential operational amplifier. However, this method does not provide galvanic isolation, and therefore can result in limited or even prohibited use in circuits requiring a high level of electrical isolation. A second known method requires the use of relatively expensive and electrically complex Hall Effect, or a similar type close-loop current sensor. In this method, the current sensor is configured to measure the current flowing through a resistor disposed across the terminals of a voltage signal to be measured. The current measurement is proportional to the voltage of interest. Drawbacks of this second approach include high cost and complexity.

SUMMARY OF THE INVENTION

This Summary and the Abstract are provided to introduce some concepts in a simplified form that are further described below in the Detailed Description. This Summary and the Abstract are not intended to identify key features or essential features of the claimed subject matter, nor is it intended to be used as an aid in determining the scope of the claimed subject matter. In addition, the description herein provided and the claimed subject matter should not be interpreted as being directed to addressing any of the short-comings discussed in the Background.

An aspect of the present invention includes a method and apparatus for actively damping a resonant LC filter using a control loop combined with a transformer-coupled voltage feedback element. The LC filter circuit is connectable to each of the terminals of power electronics configured to provide power to a load based in part on a command signal. A feedback circuit having a sense capacitor is operably couplable to both portions of the LC filter circuit. The feedback circuit provides a feedback signal when a frequency of AC voltage across the sense capacitor substantially reaches the resonant frequency of the LC filter circuit so as to actively damp the voltage across the load.

DETAILED DESCRIPTION OF THE PREFERRED EMBODIMENTS

Figure 1:
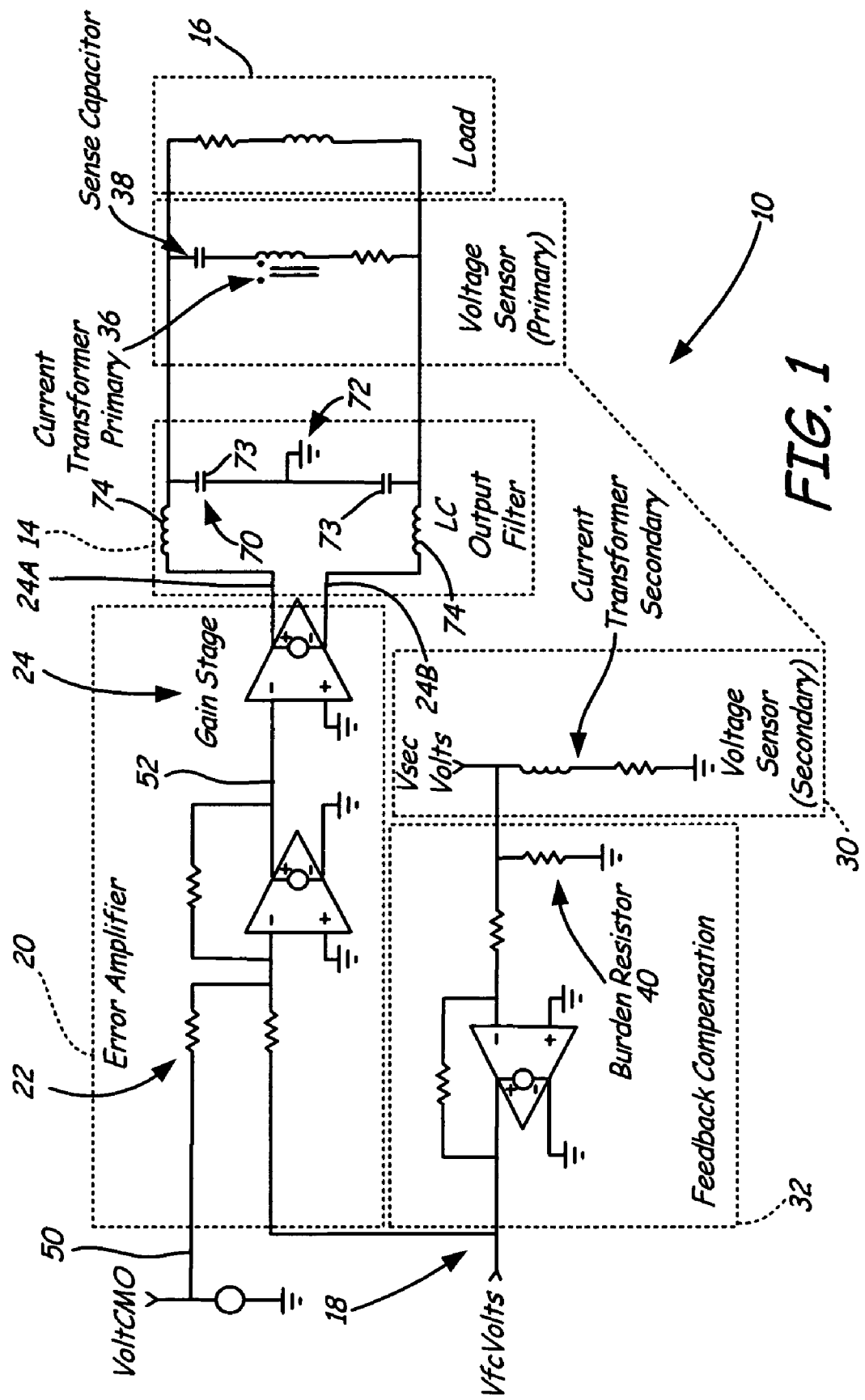
FIG. 1 is a schematic circuit diagram having an active LC damping circuit with galvanic isolation.

FIG. 1 illustrates an active LC damping circuit 10 with galvanic isolation. The schematic/block diagram is provided in FIG. 1 because as appreciated by those skilled in the art, components therein can be implemented in hardware (digital and/or analog) and or software modules as is well known in the art. However, it should be noted that the schematic diagram of FIG. 1 is typically used to model circuit 10 using analytical tools such as SPICE modeling techniques. Thus, FIG. 1 includes additional electrical components generally used to model parasitic elements of actual components.

Power amplifier electronics, herein represented by gain stage 24, provide output power to an LC filter indicated at 14, which in turn, provides power to the desired load 16.

Power amplifier electronics include modules (hardware and/or software) for receiving a command input signal and controlling power control elements to provide output power. Power amplifier electronics are well known and can take many forms, the design of which is not important for purposes of providing this description.

In an aspect of the present invention, a voltage control loop or feedback circuit 18 provides feedback for active damping. The voltage control loop 18 includes an error amplifier 20 (represented herein with summer 22 and gain stage 24), a voltage sensor 30, and a compensation network 32. In particular, the voltage sensor 30 comprises a current transformer 36, which provides galvanic isolation. As illustrated, the current transformer 36 is operably coupled to sense current flowing through a sense capacitor 38 where the output terminals, or secondary terminals, of the current transformer 36 are coupled to a burden resistor 40. A voltage signal across the burden resistor 40 is in proportion to the sensed current flowing through capacitor 38.

Figure 2:
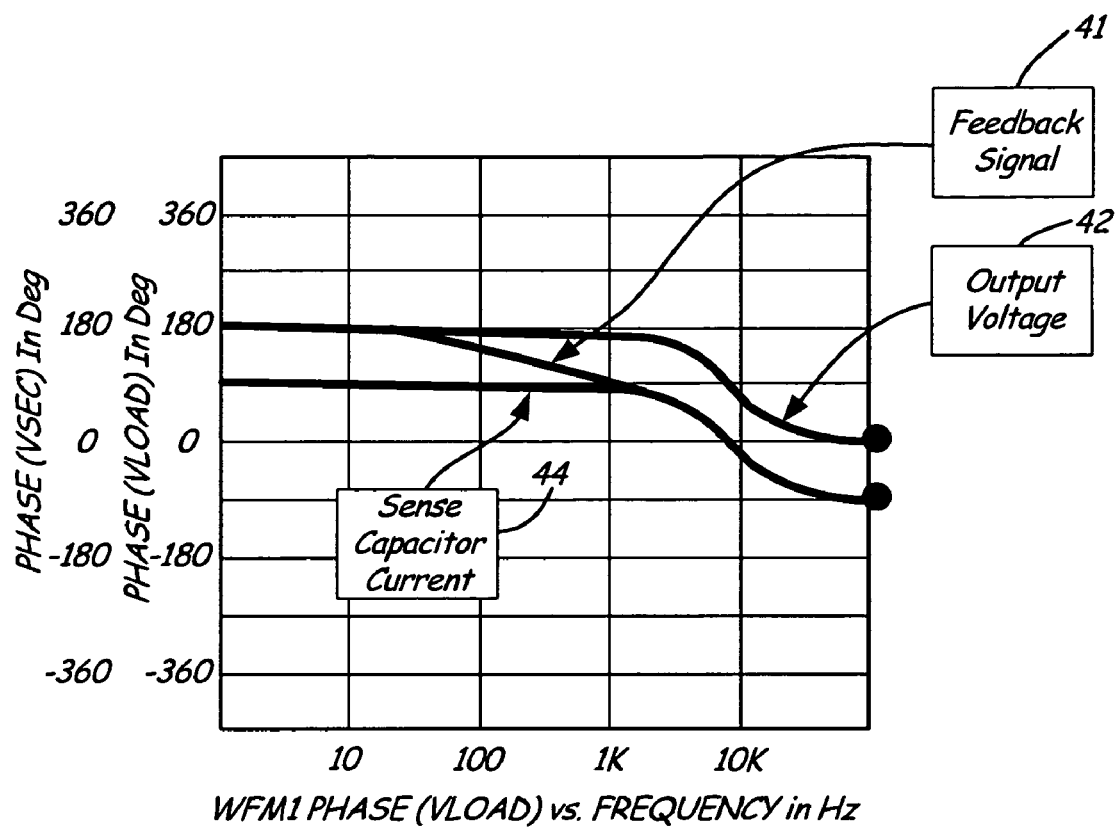
FIG. 2 illustrates plots of various signals.

A particular advantageous feature of the present invention, in one embodiment, is that the voltage feedback of the control loop 18 becomes noticeably active at least, or only, when the frequency range of the AC voltage across the sense capacitor 38 corresponds to the resonant frequency of the LC circuit 14, which is substantially higher than the corner frequency determined by the current transformer 36 and the burden resistor 40. The corner frequency is thus selectable. When the voltage feedback becomes "active" (i.e. no longer negligible and accurate or proportional with respect to the current flowing in the LC filter 14), the voltage feedback signal leads the output voltage across load 16 by approximately 90°. FIG. 2 illustrates the feedback signal at 41, the output voltage at 42 and the current in the sense capacitor 38 at 44. The feedback control loop 18 operates over a wide range, but its active influence on the output voltage 42 occurs in a narrow range of frequencies resulting from, and centered about, the resonant frequency of the LC output filter 14.

Figure 3:
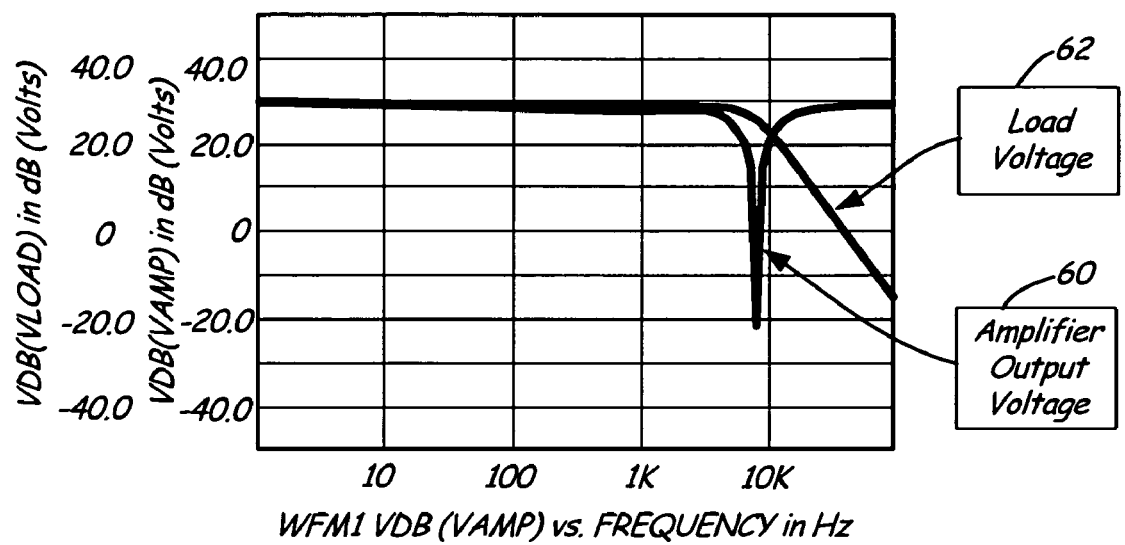
FIG. 3 illustrates plots of various signals.

The feedback or voltage signal across burden resistor 40, is scaled by feedback compensation circuit 32 and is summed with a desired command signal provided at 50 by the error amplifier 20 in order to provide a system error signal 52. In a preferred embodiment, the gain of the error amplifier 20 is configured so as to provide unity gain in the command path. In this manner, the signal by the control loop 18 is negligible at low frequencies. With the voltage feedback provided as above, attenuation or damping of the power amplifier electronic output voltage signal is achieved specifically at the point of resonance of the LC output filter 14. This is illustrated in FIG. 3 where the amplifier output voltage is indicated at 60 and the voltage across the load is indicated at 62.

It is important to note that in FIG. 1, both of the terminals 24A and 24B from the power electronics 24 include unwanted high frequency electrical activity so filtering is provided for each of the output terminals 24A and 24B.

The LC output filter 14 includes two LC circuits 70 and 72 connected to ground, where one circuit is provided on each terminal of the power electronics 24. Both LC circuits 70 and 72 include a capacitor 73 and an inductor 74. In operation, each of the LC circuits 70 and 72 can go into resonance. However, sense capacitor 38 spans across the LC circuits 70 and 72, in particular, in parallel with the series combination of capacitors 73 thereof, and thus provides a single current sense signal for current transformer 36. In this manner, the sensed signal is that of the current between the LC circuit 70 and 72 rather than sensing the current of any one LC circuit. Thereby, an advantageous indication of the state of resonance of the output filter 14 as a whole is provided rather than just one portion thereof, while using a minimal amount of components.

It should also be noted that scaling of the feedback voltage may not be necessary in some applications, for example, a simple voltage divider may be used, if desired, in combination with the burden resistor 40 to provide the desired feedback voltage. Furthermore, a low pass filter can be added to the feedback signal to compensate, or further attenuate, the feedback signal at high frequencies since the gain of the feedback signal increases with frequency due to the reduction in impedance of capacitor 38 with frequency.

A particular advantageous feature of the present invention is that the forward gain provided by the error amplifier 20 can be unity. In this manner, at low frequencies, the feedback signal has a very low amplitude and thus a negligible effect on the voltage command signal. This is due at least in part to the nature of the current transformer 36 used with the sense capacitor 38. Stated another way, the compensation network gain is adjusted such that at the desired frequency (i.e., the resonant frequency of the LC filter), or the other components of the voltage feedback signal, are adjusted so that the voltage feedback signal is strong enough to provide compensation. However, at low frequencies, it is as if the voltage feedback signal does not exist and the voltage command signal is passed with unity gain through the error amplifier 20. Thus, damping is provided for the output voltage at the resonant frequency, while allowing the power electronics to have an operable range across and including the resonant frequency.

Although the subject matter has been described in language specific to structural features and/or methodological acts, it is to be understood that the subject matter defined in the appended claims is not limited to the specific features or acts described above as has been held by the courts. Rather, the specific features and acts described above are disclosed as example forms of implementing the claims.

What is claimed is:

1. A method of actively damping voltage across an electrical load, the voltage being provided to the load by power amplifier circuit where one LC output filter is connected to each terminal of the power amplifier circuit and the electrical load, the method comprising:
    providing a feedback circuit operably coupled to the LC output filters and the power amplifier circuit, wherein the feedback circuit includes a sense capacitor operably connected to sense current between portions of the LC output filters and a burden resistor operably connected to a current transformer;
    sensing the current between the portions of the LC output filters;
    providing a feedback signal from the feedback circuit when a frequency of AC voltage across the sense capacitor substantially reaches a resonant frequency of the LC output filters; and
    operating the power amplifier circuit based on the feedback signal so as to actively damp the voltage across the load.

2. The method of claim 1 wherein providing the feedback signal comprises operation of the feedback circuit at the resonant frequency of the LC output filters.

3. An apparatus for providing electrical power through two terminals through two LC output filters wherein a portion of one LC output filter is connectable to one of the terminals and a portion of the other LC output filter is connectable to the other of the terminals, said portions being electrical components of a same type, the apparatus comprising:
    a power circuit having the two terminals configured to provide power to a load based in part on a command signal;
    a feedback circuit having a single sense capacitor operably couplable to both said portions of the LC output filters, the feedback circuit having a transformer-coupled feedback element; and
    a circuit configured to combine the command signal with a feedback signal from the feedback circuit.

4. The apparatus of claim 3 wherein the feedback element comprises a current transformer.

5. The apparatus of claim 4 wherein the feedback circuit is configured to operate and provide the feedback signal at the resonant frequency of the LC output filters.

6. The apparatus of claim 4 wherein the feedback circuit includes a burden resistor operably connected to the current transformer, and wherein the feedback circuit is configured to provide the feedback signal when a frequency of AC voltage across the sense capacitor substantially reaches the resonant frequency of the LC output filters.

7. The apparatus of claim 3 wherein the feedback circuit is configured to operate and provide the feedback signal at the resonant frequency of the LC output filters.

8. The apparatus of claim 7 wherein the feedback circuit is configured such that the feedback signal is proportional to current between the LC output filters at the resonant frequency.

9. The apparatus of claim 4 wherein the feedback circuit includes the single sense capacitor being connected in series with the current transformer, the series connected capacitor and current transformer being operably connected to the LC output filters wherein an end of the single sense capacitor opposite the current transformer is operably connected to one of said portions and an end of the current transformer opposite the single sense capacitor is connected to the other of said portions, and wherein a burden resistor is operably connected to the current transformer, and wherein the feedback circuit is configured to provide the feedback signal when a frequency of AC voltage across the single sense capacitor substantially reaches the resonant frequency of the LC output filters.

10. The apparatus of claim 3 wherein the feedback circuit includes the single sense capacitor being connected in series with the transformer-coupled feedback element, the series connected capacitor and transformer-coupled feedback element being operably connected to the LC output filters wherein an end of the single sense capacitor opposite the transformer-coupled feedback element is operably connected to one of said portions and an end of the transformer-coupled feedback element opposite the single sense capacitor is connected to the other of said portions, and wherein a burden resistor is operably connected to the transformer-coupled feedback element, and wherein the feedback circuit is configured to provide the feedback signal when a frequency of AC voltage across the single sense capacitor substantially reaches the resonant frequency of the LC output filters.

11. An apparatus for providing electrical power, the apparatus comprising:
  a power circuit configured to provide power from two terminals to a load based in part on a command signal;
  two LC output filters, wherein a portion of one LC output filter is connectable to one of the terminals and a portion of the other LC output filter is connectable to the other of the terminals, said portions being electrical components of a same type;
  a feedback circuit operably connected to the LC output filters to sense the current between each of the portions, the feedback circuit having a transformer-coupled feedback element; and
  a circuit configured to combine the command signal with a feedback signal from the feedback circuit.

12. The apparatus of claim 11 wherein the feedback element comprises a current transformer.

13. The apparatus of claim 12 wherein the feedback circuit is configured to operate and provide the feedback signal at the resonant frequency of the LC output filters.

14. The apparatus of claim 12 wherein the feedback circuit includes a sense capacitor connected in series with the current transformer, the series connected sense capacitor and current transformer being operably connected to the LC output filters wherein an end of the sense capacitor opposite the current transformer is operably connected to one of said portions and an end of the current transformer opposite the sense capacitor is connected to the other of said portions, and wherein a burden resistor is operably connected to the current transformer, and wherein the feedback circuit is configured to provide the feedback signal when a frequency of AC voltage across the sense capacitor substantially reaches the resonant frequency of the LC output filters.

15. The apparatus of claim 11 wherein the feedback circuit is configured to operate and provide the feedback signal at the resonant frequency of the LC output filters.

16. The apparatus of claim 15 wherein the feedback circuit is configured such that the feedback signal is proportional to current in the LC output filters at the resonant frequency.

17. The apparatus of claim 11 wherein said portions comprise inductors.

18. The apparatus of claim 11 wherein each of the terminals of the power circuit supplies unwanted high frequency electrical activity when the power circuit are operated, the electrical activity being un-damped voltage oscillation generated by the corresponding LC output filter at the natural frequency of the LC output filter.

19. The apparatus of claim 11 wherein each of the LC output filters are configured to filter unwanted high frequency electrical activity supplied from each connected corresponding terminal, the electrical activity being un-damped voltage oscillation generated by the corresponding LC output filter at the natural frequency of the LC output filter.

20. The apparatus of claim 12 wherein the feedback circuit includes a sense capacitor connected in series with the transformer-coupled feedback element, the series connected sense capacitor and transformer-coupled feedback element being operably connected to the LC output filters wherein an end of the sense capacitor opposite the transformer-coupled feedback element is operably connected to one of said portions and an end of the transformer-coupled feedback element opposite the sense capacitor is connected to the other of said portions, and wherein a burden resistor is operably connected to the transformer-coupled feedback element, and wherein the feedback circuit is configured to provide the feedback signal when a frequency of AC voltage across the sense capacitor substantially reaches the resonant frequency of the LC output filters.

* * * * *